(12) United States Patent
Goyette et al.

(10) Patent No.: US 7,724,117 B2
(45) Date of Patent: May 25, 2010

(54) MULTILAYER PASSIVE CIRCUIT TOPOLOGY

(75) Inventors: William R. Goyette, San Marcos, CA (US); Frank B. Winter, San Diego, CA (US); Eric C. Johnston, San Diego, CA (US); Hardik Patel, San Diego, CA (US)

(73) Assignee: Northrop Grumman Systems Corporation, Los Angeles, CA (US)

( * ) Notice: Subject to any disclaimer, the term of this patent is extended or adjusted under 35 U.S.C. 154(b) by 0 days.

(21) Appl. No.: 12/013,170

(22) Filed: Jan. 11, 2008

(65) Prior Publication Data

US 2009/0179722 A1 Jul. 16, 2009

(51) Int. Cl.
*H01F 5/00* (2006.01)
(52) U.S. Cl. .................................... 336/200
(58) Field of Classification Search ............. 336/200, 336/232; 333/168–185; 361/111, 120–123
See application file for complete search history.

(56) References Cited

U.S. PATENT DOCUMENTS

| 7,084,722 | B2 | 8/2006 | Goyette |
| 7,088,215 | B1 | 8/2006 | Winter et al. |
| 7,161,784 | B2 * | 1/2007 | Cheung et al. ............. 361/111 |
| 2004/0008095 | A1 * | 1/2004 | Siavash ...................... 333/168 |

FOREIGN PATENT DOCUMENTS

JP 10126193 A * 5/1998

* cited by examiner

*Primary Examiner*—Tuyen Nguyen
(74) *Attorney, Agent, or Firm*—Tarolli, Sundheim, Covell & Tummino LLP

(57) ABSTRACT

A multilayer passive circuit topology is disclosed. In one embodiment, a multilayer circuit is provided. The multilayer circuit comprises a multilayer inductor comprising a first set of parallel conductive traces formed on a first layer, a second set of parallel conductive traces formed on a second layer spaced apart from the first layer; and a plurality of vias that connect respective parallel conductive traces from the first and second layer to form inductor windings. The multilayer circuit further comprises a multilayer capacitor connected to an end of the inductor by a coupling via, the capacitor comprising a first conductive plate and a second conductive plate being spaced apart from one another and being formed on different layers.

20 Claims, 5 Drawing Sheets

US 7,724,117 B2

MULTILAYER PASSIVE CIRCUIT TOPOLOGY

TECHNICAL FIELD

The present invention relates generally to communications, and more particularly to a multilayer passive circuit topology.

BACKGROUND OF THE INVENTION

RF and IF filters are typically used in RF Communications Transceivers (Transmitters and Receivers) for pre- or post-selection of desired signals. Filters are typically sub-octave and enhance receiver (RX) selectivity by rejecting unwanted signals at image frequencies and other points of spurious sensitivity. For a transmitter (TX), filters reject unwanted spurious and harmonics prior to final RF power amplification. Filters are also used at intermediate frequencies in both up/down conversion architecture to reject unwanted signals, as described above.

In a harsh environment, filter response is required to roll-off rapidly outside the band of interest, necessitating a high order filter. In addition, in-band loss must be minimized through the filter to minimize signal degradation. These two requirements drive precision (less than 2% tolerance), high-Q (Quality factor) inductors and capacitor lumped element implementations. Such elements typically have Q's greater than 100 and are typically required for narrow band or high rejection stopband/selectivity performance. Typically, high performance lumped filters require significant touch labor for assembly and tuning. Typical integrated microwave assemblies (IMA) use LC (inductor-capacitor) filters utilizing air core solenoid wire inductors (air or wrapped coil-forms) and parallel plate capacitors that are hand trimmed and tuned, as surface mount components usually do not have the required precision, nor the necessary Q. The latter is especially pertinent to smaller solenoidal SMT inductors, usually attaining precision between 2% to 5% and Q's less than 100 for optimal small sizes. Other implementations of solenoidal inductors are referenced in U.S. Pat. No. 7,088,215, entitled, "Embedded Duo Planar Printed Inductor", the entire content of which is hereby incorporated herein. Although providing desirable operations, this approach provides for part of a printed substrate using expensive materials, such as low temperature co-fired ceramic (LTCC). In certain cost sensitive applications, a lower cost material set may be desired with high yield and without added human tuning requirements.

The complexity of hand tuned filters increases exponentially with the order of the filter. In addition, hand tuned lumped filters are packaged to ensure electrical performance and isolation. Highest Q inductors are typically constructed with air cores and require large volumes. Consequently inductor diameters for lower frequency filter applications (below 1 GHz) are large and result in package heights to greater than 0.25 inches. This height is unacceptable for many compact filter requirements. In addition, tight packing densities induce interaction with other inductor elements, reducing performance and increasing tuning complexities. Additional walls are thus typically added for effective isolation and/or rejection, increasing complexity and adding cost and size.

SUMMARY OF THE INVENTION

In one aspect of the invention, a multilayer circuit is provided. The multilayer circuit comprises a multilayer inductor comprising a first set of parallel conductive traces formed on a first layer, a second set of parallel conductive traces formed on a second layer spaced apart from the first layer; and a plurality of vias that connect respective parallel conductive traces from the first and second layers to form inductor windings. The multilayer circuit further comprises a multilayer capacitor connected to an end of the inductor by a coupling via, the capacitor comprising a first conductive plate and a second conductive plate being spaced apart from one another and being formed on different layers.

In another aspect of the invention, another multilayer circuit is provided. The multilayer circuit comprises a plurality of multilayer inductors, each multilayer inductor being formed from a first set of parallel conductive traces and a second set of parallel conductive traces formed on different spaced apart layers and a plurality of vias that connect respective parallel conductive traces from the different layers to form inductor windings. The multilayer circuit further comprises a plurality of multilayer capacitors, each multilayer capacitor being formed from a first conductive plate and a second conductive plate formed on different layers wherein the plurality of multilayer inductors and the plurality multilayer capacitors are arranged in a circuit.

In another aspect of the invention, a method of fabricating a multilayer circuit is provided. The method comprises etching a first set of parallel conductive traces on a first layer, etching a second set of parallel conductive traces on a second layer spaced apart from the first layer and forming a plurality of vias that connect respective parallel conductive traces from the first and second layers to form a multilayer inductor. The method further comprises etching a first conductive plate on a third layer; etching a second conductive plate on a fourth layer being spaced apart from third layer to form a multilayer capacitor and forming a coupling via that connects the multilayer inductor to the multilayer capacitor.

DETAILED DESCRIPTION OF INVENTION

The present invention relates to a multilayer passive circuit topology supporting any applications requiring precision inductors and capacitors in a low cost material. The multilayer passive circuit topology provides inductor-capacitor (LC) circuits formed from multilayer inductors and multilayer capacitors that can be configured as filters, matching structures, resonators, oscillators or a variety of other LC circuit types. The employment of multilayer passive circuits (e.g., inductors and capacitors), rather than hand-tuned inductors and capacitors, reduces circuit production time, cost, weight and volume. The result is a low cost, highly selective and repeatable multilayer passive structure that can be integrated into a multilayer structure, such as a printed wiring board (PWB) or can be separately surface mounted as a sub-assembly in a manner that minimizes component height, supporting dense electronics packaging. The multilayer passive circuit topology allows for production of sub 2% inductors due to reduced parasitics, reduced inductor capacitance and the ability to provide very tight tolerances.

Figure 1:
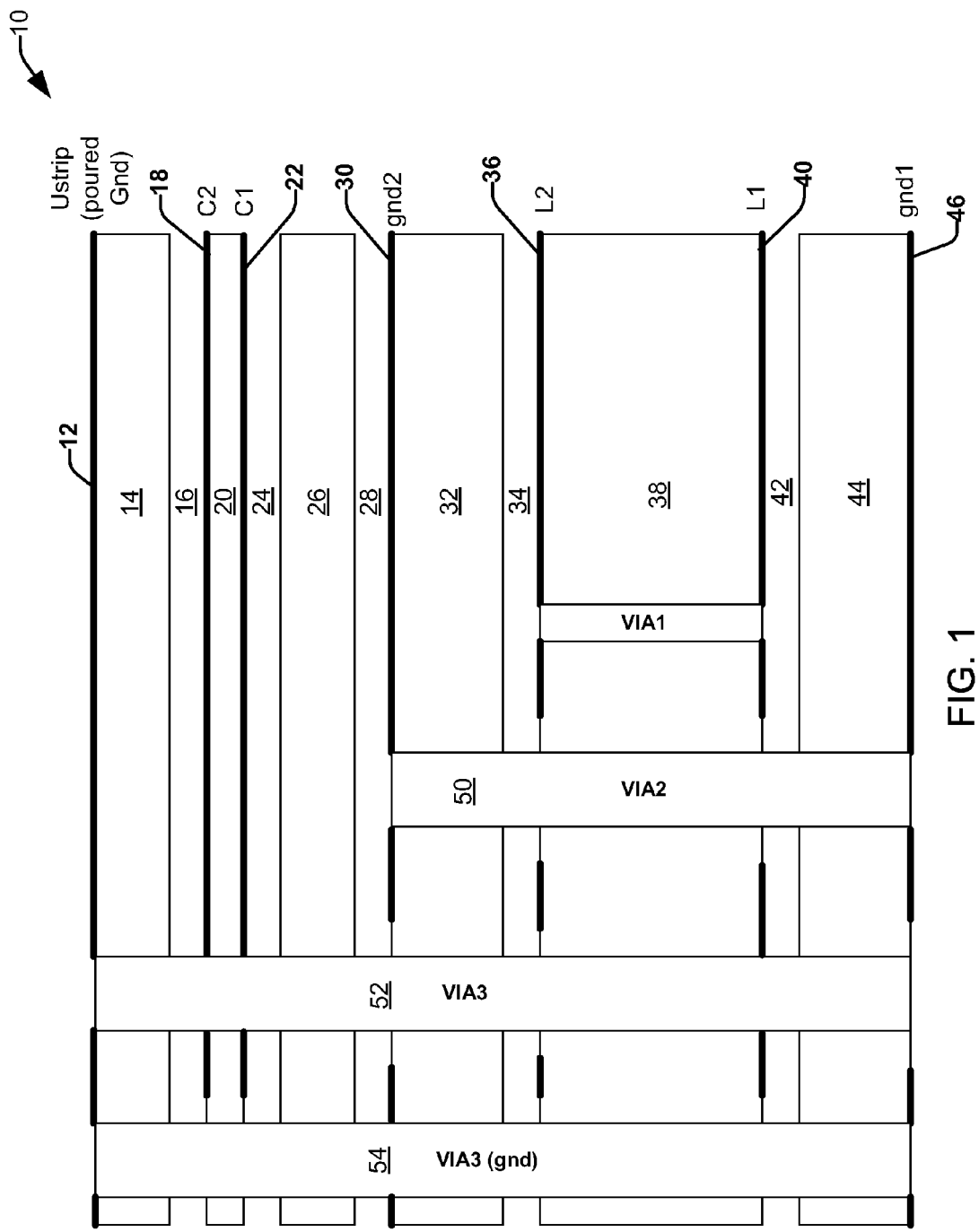
FIG. 1 illustrates a cross-section of a multi-layer passive circuit in accordance with an aspect of the present invention.

FIG. 1 illustrates a cross-section of a multi-layer passive circuit 10 in accordance with an aspect of the present invention. The multi-layer passive circuit 10 is a single inductor-capacitor (LC) circuit that can be employed as, for example, a filter and yields a highly producible passive circuit using multilayer embedded passive components. The present example is illustrated with respect to a PWB but could be formed on a number of different multilayer structures, such as a low temperature co-fired ceramic (LTCC) structure, a multilayer semiconductor structure, a monolithic microwave integrated circuit (MMIC), liquid crystal polymer (LCP) structures or another type of multilayer circuit structure. Other suitable technologies would include RFIC processes including but not limited to SiGe, GaAs, GaN, etc.

The multi-layer passive circuit includes a top microstrip layer 12 that forms a poured ground layer disposed above a first dielectric layer 14 that is disposed above a second dielectric layer 16. A multilayer capacitor is formed below the second dielectric layer 16. The multilayer capacitor is formed by a first metal plate layer 18, a third dielectric layer 20 disposed below the first metal plate layer 18, and a second metal plate layer 22 is disposed below the third dielectric layer 20. A parallel plate pair C1, C2 on the first metal plate layer 18 and second metal plate layer 22 form the multilayer capacitor. A fourth dielectric layer 24, a fifth dielectric layer 26 and a sixth dielectric layer 28 are disposed beneath the multilayer capacitor.

A metal ground layer 30 (gnd2) is disposed beneath the sixth dielectric layer 28 followed by a seventh dielectric layer 32 and an eight dielectric layer 34. A multilayer inductor is disposed beneath the eighth dielectric layer 34. The multilayer inductor is formed by a first conductive trace layer 36, a ninth dielectric layer 38 disposed below the first conductive trace layer 36, and a second conductive trace layer 40 disposed below the ninth dielectric layer 38. The multilayer inductor is comprised of a first set of parallel conductive traces L2 formed on the first conductive trace layer 36, a second set of parallel conductive traces L1 formed on the second conductive trace layer 40 and a plurality of buried vias 48 coupling respective parallel conductive traces from the first and second conductive trace layers 36 and 40. A tenth dielectric layer 42 and an eleventh dielectric layer 44 are disposed beneath the multilayer inductor and a ground layer 46 (gnd1) is disposed beneath the eleventh dielectric layer 44.

The first, third, fifth, seventh, ninth and eleventh dielectric layers can be formed of a first dielectric material such as Rogers R3003. The second, fourth, sixth, eight and tenth dielectric layers can be formed of a second dielectric material, such as GETEK. Through vias (VIA3) are used to connect between the microstrip layer and the buried multilayer capacitor and multilayer inductor. Ground is implemented with through vias (VIA3 (gnd)) and the blind via (VIA2). This structure of FIG. 1 can comprise a standalone surface mount PWB "brick" or be implemented in a greater PWB structure.

Figure 2:
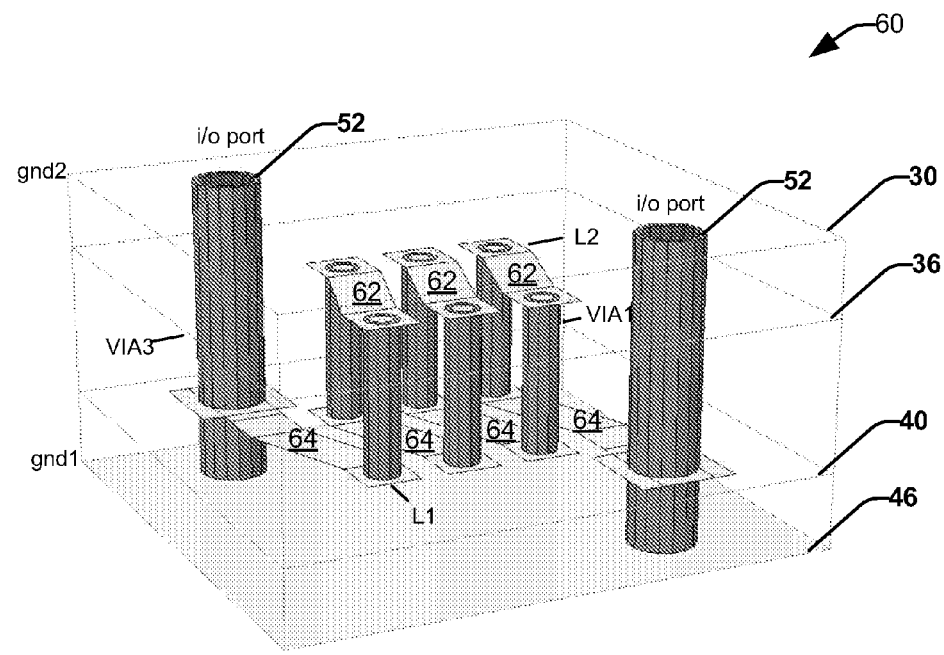
FIG. 2 illustrates a perspective view of a multilayer inductor in accordance with an aspect of the invention.

FIG. 2 illustrates a perspective view of a multilayer inductor 60 in accordance with an aspect of the invention. The multilayer inductor 60 may be an exemplary embedded rectangular inductor that can be built using the first and second conduct trace layers 36 and 40 and the plurality of buried vias 48 as shown in FIG. 1. A first set of parallel horizontal conducive traces 62 (L2) are etched on the first conductive trace layer 36 and a second set of parallel horizontal conducive traces 64 (L1) are etched on the second conductive trace layer 40 with embedded vias 48 employed to connect respective conductive traces on the first and second conductive trace layers 36 and 40 to form rectangular solenoid windings. Two through-vias 52 are employed as input/outports to bring the signal in and out of the inductor. Two ground layers 30 and 46 and a set of ground vias 50 (not shown) around the periphery of the inductor are used to contain the electric field. The following parameters affect the performance of the inductor: number of turns, trace width and spacing, core material (thickness, dielectric constant, loss tangent), via size, and metallization. EM simulation tools can be used to optimize the design, typically to achieve a producible, high Q inductor of the desired inductance value. Repeatable (within production lots) inductors with very high Qs, in the range of 120-150, are achievable.

Figure 3:
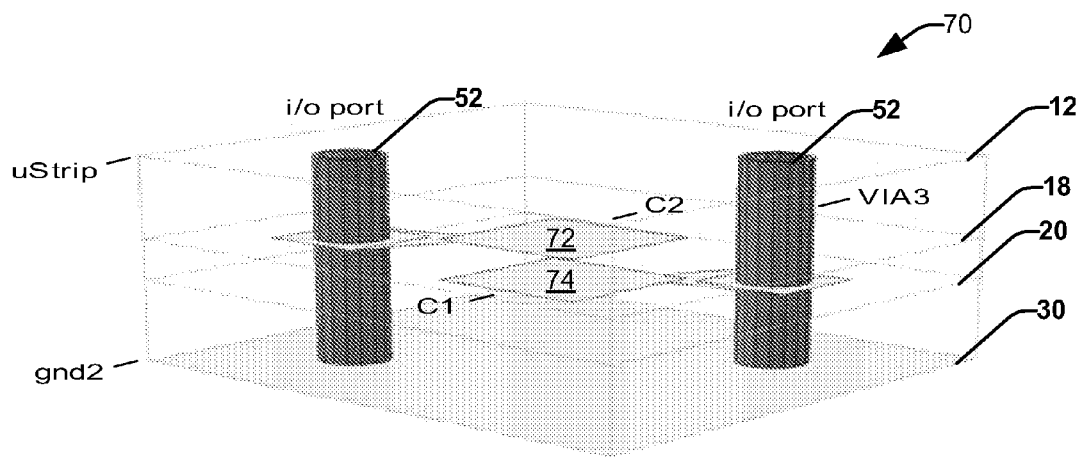
FIG. 3 illustrates a perspective view of a multilayer capacitor in accordance with an aspect of the invention.

FIG. 3 illustrates a perspective view of a multilayer capacitor 70 in accordance with an aspect of the invention. The multilayer capacitor 70 may be an exemplary embedded capacitor that can be built using the first and second metal plate layers 18 and 22 as shown in FIG. 1. A first metal plate C1 of a desired area is etched on the second metal plate layer 22 and a second metal plate C2 of a similar area is etched on the first metal plate layer 18 in a parallel relationship to one another forming a multilayer capacitor. The following parameters affecting the performance of the capacitor, core material (thickness, dielectric constant and loss tangent), metal plate dimensions (area and etch variation). Two through-vias 52 are employed as input/output to bring the signal in and out of the capacitor and couple the multilayer capacitor to the multilayer inductor. Two ground layers 12 and 30 isolate the capacitor 70 from the inductor 60.

Figure 4:
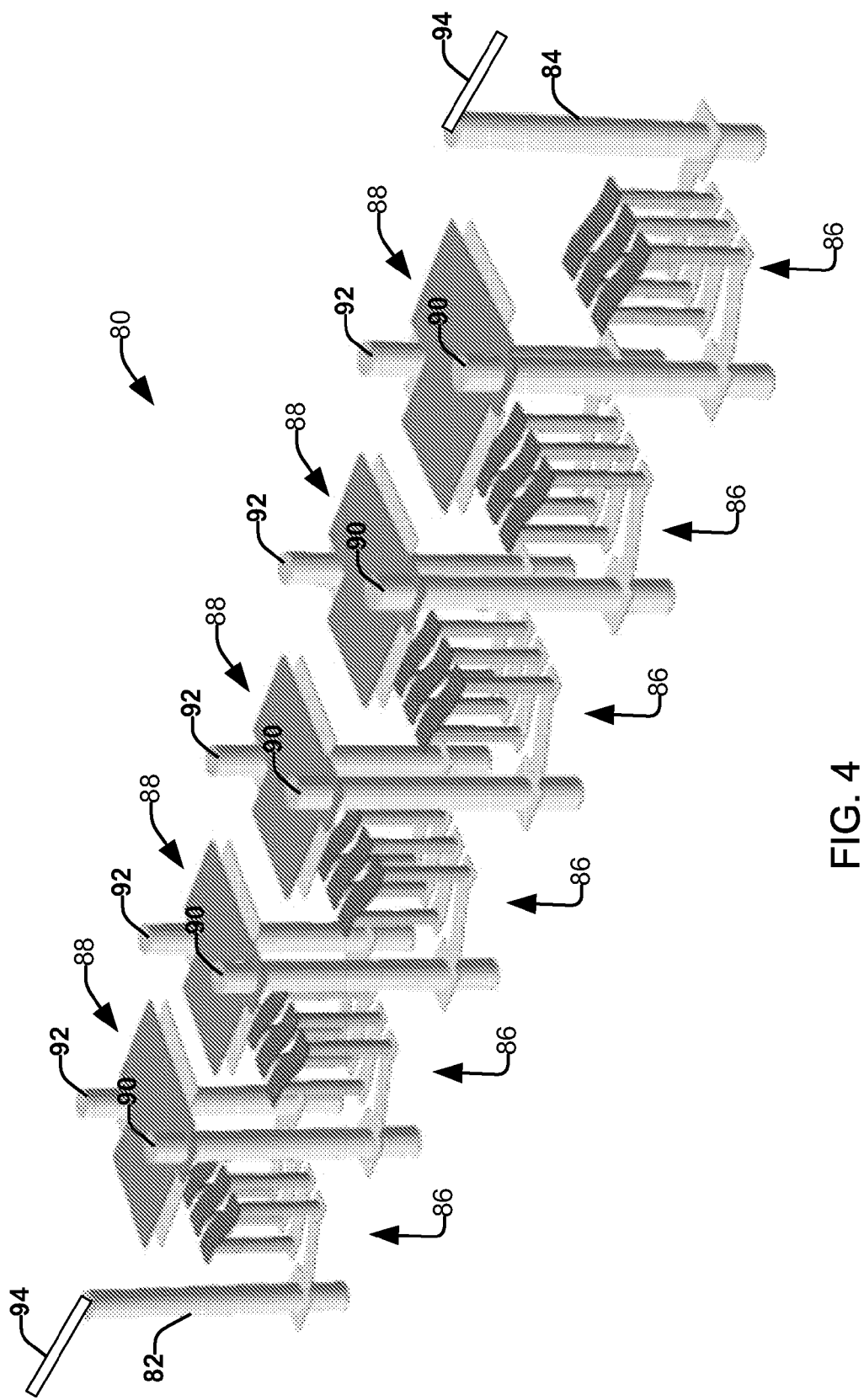
FIG. 4 illustrates a perspective view of a multi-layer inductor-capacitor (LC) circuit in accordance with an aspect of the present invention.

It is to be appreciated that the present invention is not limited to a single LC circuit topology. FIG. 4 illustrates a multi-layer LC circuit 80 that includes multiple multilayer inductors 86 and multiple multilayer capacitors 88 coupled in a LC circuit series configuration. A first through via 82 and a second through via 84 are provided as input/output ports of the multilayer passive circuit 80. Each of a set of multilayer inductors 86 are serially coupled to respective ones of each of a set of multilayer capacitors 88 via coupling vias 92 to form respective multilayer LC circuits. The multilayer LC circuits are coupled to one another via connecting vias 90 to form the multiple multilayer LC circuits 80 coupled in a series configuration. The multilayer LC circuit 80 can be configured as a multiple pole filter. It is to be appreciated that the passive circuits could include resistor elements 94, for example, be employing a resistive material to form RLC, RL, or RC circuits. It is also to be appreciated that although the inductors and capacitors are illustrated on different multiple layers, the capacitors and inductors could share layers. Furthermore, although the inductors are illustrated as disposed in layers beneath the capacitors, it is to be appreciated that the inductors can reside in layers above the capacitors without effecting the operation of the multi-layer passive circuit 80.

In accordance with an aspect of the present invention, the multilayer passive components can be used to construct filters with broad ranges of bandwidths and filter orders. Since embedded multilayer passive components can be employed to implement both series and shunt components, therefore the employment of multilayer passive components can be employed to be used for substantially any filter topology. It is also to be appreciated that mixed or "hybrid" combinations of distributed structures (transmission lines, radial elements, etc) can provide additional filtering capabilities.

Figure 5:
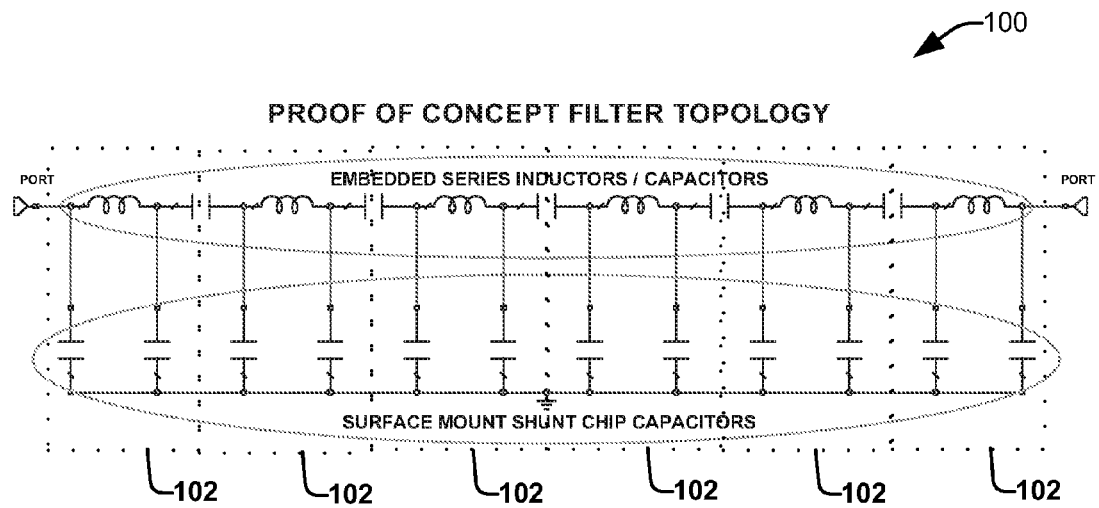
FIG. 5 illustrates a schematic drawing of a sixth order tubular filter topology in accordance with an aspect of the present invention.
Figure 6:
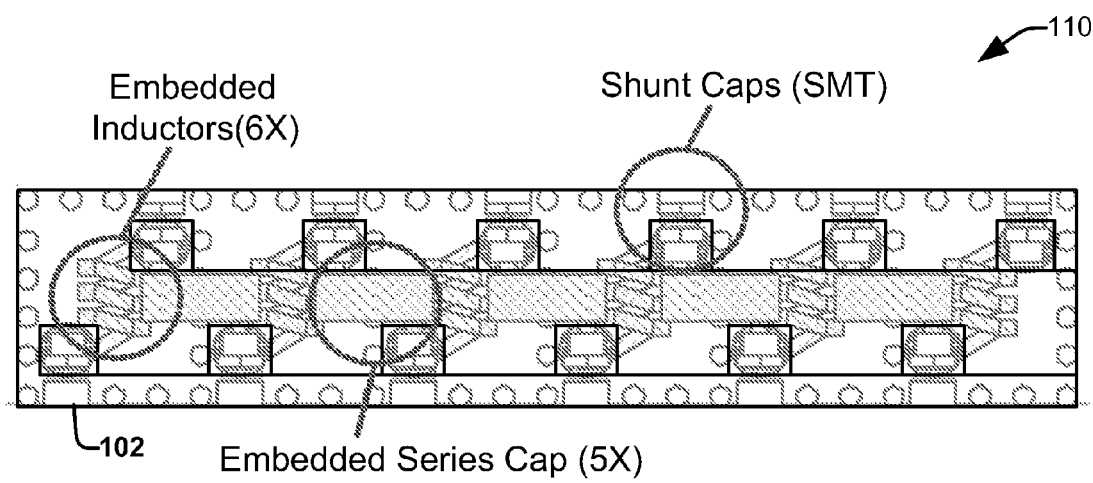
FIG. 6 illustrates a top view of an exemplary integrated filter employing the sixth order tubular filter topology of FIG. 5 in accordance with an aspect of the present invention.

FIG. 5 illustrates a schematic drawing of a sixth order tubular filter topology 100 in accordance with an aspect of the present invention. The sixth order tubular filter topology 100 include six multilayer embedded series coupled LC circuits connected between an input port and an output port. A surface mount shunt chip capacitor couples each intermediate node to ground. The surface mount shunt chip capacitors are employed to tune the filter. In this design all the series components were implemented using embedded passives and high precision discrete shunt capacitors were used to tune the filter. Each multilayer embedded inductor is electrically isolated from one another employing a faraday cage 102 formed of a plurality of spaced apart parallel vias. FIG. 6 illustrates a top view of an exemplary integrated filter 110 employing the sixth order tubular filter topology of FIG. 5 in accordance with an aspect of the present invention.

Although the entire filter of FIG. 6 can be constructed using embedded multilayer passive components, in this implementation, the shunt capacitors are left as discrete high precision parts due to size considerations but primarily to give the filter tunability. Variation in the accuracy of the embedded passives can be compensated by adjusting the shunt capacitor values. Variation between production PWB lots will be minimal, and once a filter is aligned by varying the discrete shunt capacitors, the same changes can be applied to rest of the boards from that lot without having to retune each one individually. Other implementations could use tunable varactor diodes, micromachined electro-mechanical (MEMs) switches, or tunable dielectric materials to effect filter tuning. It is to be appreciated that the use of multilayer embedded passive circuits (inductors and capacitors), rather than hand-tuned inductors and capacitors, can greatly reduce filter production time, cost, weight and volume. The result is a low cost, highly selective and repeatable multilayer embedded passive filter structure that can be integrated into a printed wiring board or separately surface mounted as a sub-assembly in a manner that minimizes component height, supporting dense electronics packaging.

Figure 7:
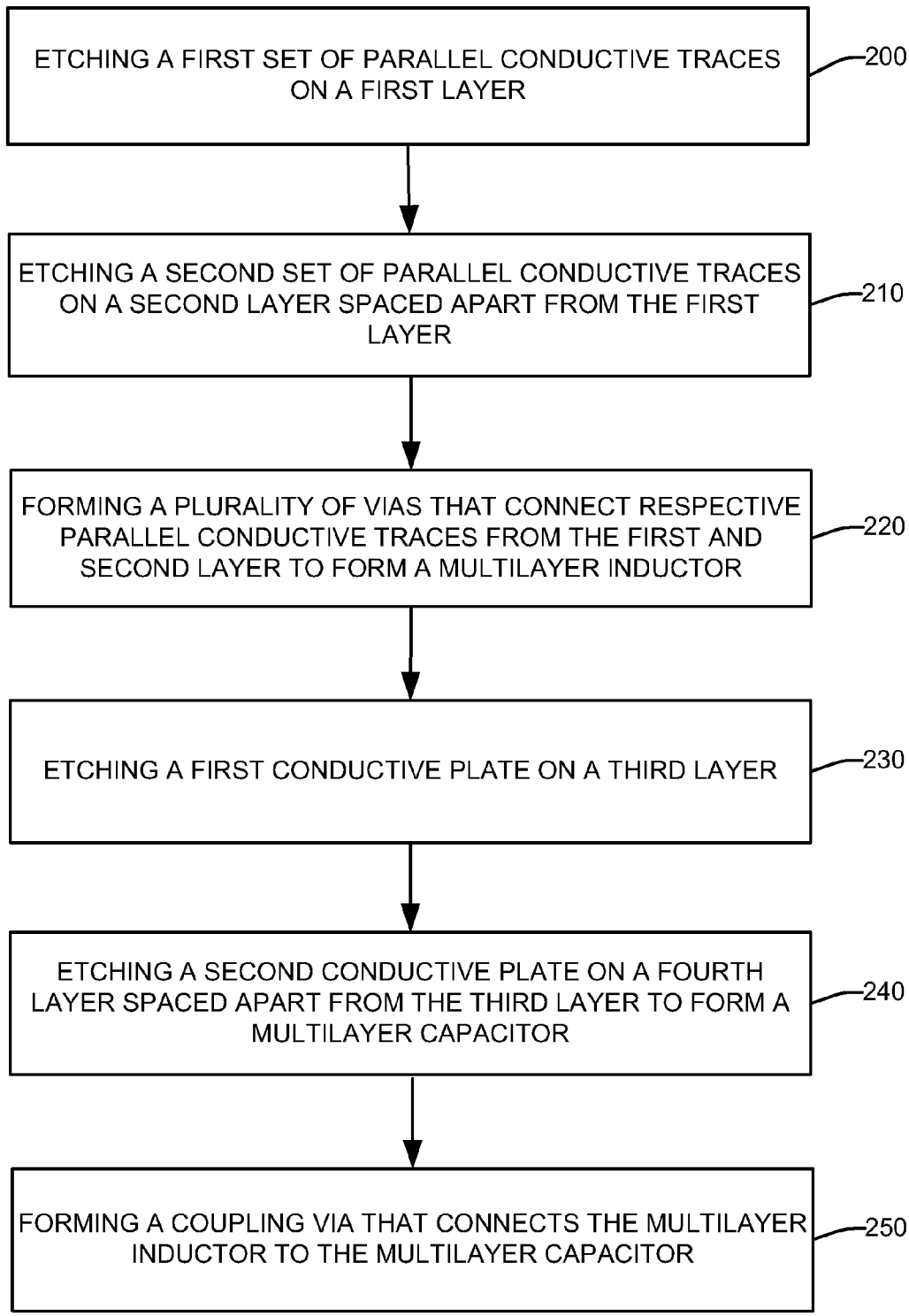
FIG. 7 illustrates a methodology for fabricating a multilayer circuit in accordance with an aspect of the present invention.

In view of the foregoing structural and functional features described above, a method will be better appreciated with reference to FIG. 7. It is to be understood and appreciated that the illustrated actions, in other embodiments, may occur in different orders and/or concurrently with other actions. Moreover, not all illustrated features may be required to implement a method.

FIG. 7 illustrates a methodology for fabricating a multilayer circuit in accordance with an aspect of the present invention. At 200, a first set of parallel conductive traces are etched on a first layer. At 210, a second set of parallel conductive traces are etched on a second layer spaced apart from the first layer. At 220, a plurality of vias are formed that connect respective parallel conductive traces from the first and second layers to form a multilayer inductor. The methodology then proceeds to 230. At 230, a first conductive plate is formed on a third layer. At 240, a second conductive plate is formed on a fourth layer spaced apart from the third layer to form a multilayer capacitor. At 250, a coupling via is formed that connects the multilayer inductor to the multilayer capacitor. It is to be appreciated that the methodology is not limited to the fabrication of a single LC circuit, but that a plurality of inductors and capacitors can be formed and arranged to build a variety of different circuit configurations (e.g., filters, matching structures, resonators, oscillators or a variety of other LC circuit types).

What has been described above includes exemplary implementations of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations.

What is claimed is:

1. A multilayer circuit comprising:
a multilayer inductor comprising;
a first set of parallel conductive traces formed on a first layer;
a second set of parallel conductive traces formed on a second layer spaced apart from the first layer; and
a plurality of vias that connect respective parallel conductive traces from the first and second layers to form inductor windings; and
a multilayer capacitor connected to an end of the inductor by a coupling via, the capacitor comprising a first conductive plate and a second conductive plate being spaced apart from one another and being formed on different layers.

2. The circuit of claim 1, wherein the different layers comprise a third layer and a fourth layer, and further comprising a dielectric layer disposed between the third and fourth layers.

3. The circuit of claim 1, further comprising a dielectric layer disposed between the first and second layers.

4. The circuit of claim 1, further comprising a ground layer disposed between the multilayer inductor and multilayer capacitor to isolate the multilayer inductor from the multilayer capacitor.

5. The circuit of claim 1, further comprising a first input/output via coupled to an end of the multilayer inductor and a second input/output via coupled to an end of the multilayer capacitor.

6. The circuit of claim 1, further comprising a plurality of multilayer inductors and a plurality multilayer capacitors affanged in a circuit.

7. The circuit of claim 6, wherein the plurality of multilayer inductors and plurality of multilayer capacitors are arranged as a plurality of inductor-capacitor circuits interconnected with one another to form a multi-pole filter.

8. The circuit of claim 7, further comprising a plurality of tuning capacitors coupled on opposing ends of each of the plurality of multilayer inductors.

9. The circuit of claim 8, further comprising a plurality of sets of a plurality of space apart parallel vias arranged to form faraday cages to surround and isolate each of the multilayer inductor and associated tuning capacitors.

10. The circuit of claim 1, further comprising a resistive element coupled to at least one of the multilayer inductor and multilayer capacitor.

11. A multilayer circuit comprising:
a plurality of multilayer inductors, each multilayer inductor being formed from a first set of parallel conductive traces and a second set of parallel conductive traces formed on different spaced apart layers and a plurality of vias that connect respective parallel conductive traces from the different layers to form inductor windings; and
a plurality of multilayer capacitors, each multilayer capacitor being formed from a first conductive plate and a second conductive plate formed on different layers wherein the plurality of multilayer inductors and the plurality multilayer capacitors are arranged in a circuit.

12. The circuit of claim 11, further comprising a dielectric layer disposed between the different layers of each of the multilayer inductor and multilayer capacitor.

13. The circuit of claim 11, wherein the plurality of multilayer inductors and plurality of multilayer capacitors are arranged as a plurality of inductor-capacitor circuits interconnected with one another to form a multi-pole filter.

14. The circuit of claim 13, further comprising a plurality of tuning capacitors coupled on opposing ends of each of the plurality of multilayer inductors.

15. The circuit of claim 14, further comprising a plurality of sets of a plurality of space apart parallel vias arranged to form faraday cages to surround and isolate each of the multilayer inductors and associated tuning capacitors.

16. A method of fabricating a multilayer circuit, the method comprising:
   forming a first set of parallel conductive traces on a first layer;
   forming a second set of parallel conductive traces on a second layer spaced apart from the first layer;
   forming a plurality of vias that connect respective parallel conductive traces from the first and second layers to form a multilayer inductor;
   forming a first conductive plate on a third layer;
   forming a second conductive plate on a fourth layer being spaced apart from third layer to form a multilayer capacitor; and
   forming a coupling via that connects the multilayer inductor to the multilayer capacitor.

17. The method of claim 16, wherein the forming a first set of parallel conductive traces on a first layer, the forming a second set of parallel conductive traces on a second layer spaced apart from the first layer and the forming a plurality of vias that connect respective parallel conductive traces from the first and second layers to form a multilayer inductor comprises forming a plurality of sets of a first set of parallel conductive traces on the first layer, forming a plurality of sets of a second set of parallel conductive traces on the second layer spaced apart from the first layer and forming a plurality of sets of the plurality of vias that connect respective parallel conductive traces from the first and second layers to form a plurality of multilayer inductors.

18. The method of claim 17, wherein the forming a first conductive plate on a third layer, the forming a second conductive plate on a fourth layer being spaced apart from third layer to form a multilayer capacitor and the forming a coupling via that connects the multilayer inductor to the multilayer capacitor comprises forming a plurality of sets of a first conductive plate on a third layer comprises forming a plurality of sets of a second conductive plate on a fourth layer being spaced apart from third layer to form a plurality of multilayer capacitors and forming a plurality of sets of a coupling via that connects the multilayer inductors to the multilayer capacitors.

19. The method of claim 18, wherein the plurality of multilayer inductors and plurality of multilayer capacitors are arranged as a plurality of inductor-capacitor circuits interconnected with one another to form a multipole filter.

20. The method of claim 19, further comprising coupling a plurality of tuning capacitors on opposing ends of each of the plurality of multilayer inductors and forming a plurality of sets of a plurality of space apart parallel vias arranged to form faraday cages to surround and isolate each of the multilayer inductor and associated tuning capacitors.

* * * * *